(12) United States Patent
Wada et al.

(10) Patent No.: US 7,097,957 B2
(45) Date of Patent: Aug. 29, 2006

(54) PHOTOSENSITIVE RESIN LAMINATE

(75) Inventors: Toru Wada, Ohtsu (JP); Keiichi Motoi, Ohtsu (JP); Yuji Taguchi, Ohtsu (JP); Satoshi Imahashi, Ohtsu (JP); Masaou Matsuda, Osaka (JP); Kazuo Takahashi, Ohtsu (JP); Koji Syoki, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 10/279,005

(22) Filed: Oct. 24, 2002

(65) Prior Publication Data

US 2003/0082482 A1 May 1, 2003

(30) Foreign Application Priority Data

| Oct. 24, 2001 | (JP) | ............................. 2001-326576 |
| Dec. 26, 2001 | (JP) | ............................. 2001-394640 |
| Jan. 11, 2002 | (JP) | ............................. 2002-005096 |
| Mar. 18, 2002 | (JP) | ............................. 2002-074570 |
| Mar. 18, 2002 | (JP) | ............................. 2002-074571 |
| Apr. 12, 2002 | (JP) | ............................. 2002-111072 |
| Apr. 12, 2002 | (JP) | ............................. 2002-111073 |
| May 14, 2002 | (JP) | ............................. 2002-138866 |
| Sep. 6, 2002 | (JP) | ............................. 2002-261878 |
| Oct. 2, 2002 | (JP) | ............................. 2002-290253 |

(51) Int. Cl.
*G03F 7/95* (2006.01)

(52) U.S. Cl. ............................. 430/273.1; 430/278.1; 430/306; 430/944

(58) Field of Classification Search ............... 430/273.1
See application file for complete search history.

(56) References Cited

U.S. PATENT DOCUMENTS

| 4,132,168 | A |   | 1/1979 | Peterson |
| 4,214,965 | A | * | 7/1980 | Rowe ........................... 522/96 |
| 4,323,637 | A | * | 4/1982 | Chen et al. ............... 430/271.1 |
| 4,430,366 | A | * | 2/1984 | Crawford et al. ........... 427/162 |
| 4,883,742 | A | * | 11/1989 | Wallbillitch et al. ..... 430/275.1 |
| 5,171,650 | A | * | 12/1992 | Ellis et al. ..................... 430/20 |
| 5,308,737 | A | * | 5/1994 | Bills et al. .................. 430/201 |
| 5,379,698 | A | * | 1/1995 | Nowak et al. .............. 101/454 |
| RE35,512 | E | * | 5/1997 | Nowak et al. .............. 101/454 |
| 5,719,009 | A |   | 2/1998 | Fan |
| 6,238,837 | B1 |   | 5/2001 | Fan |
| 6,245,486 | B1 |   | 6/2001 | Teng |

FOREIGN PATENT DOCUMENTS

| EP | 0 741 330 A1 | * | 11/1996 |
| EP | 1 146 392 |   | 10/2001 |
| EP | 1382446 A1 |   | 1/2004 |
| WO | WO 94/03838 |   | 8/1993 |
| WO | WO 01/6364 |   | 8/2001 |
| WO | WO 01/63364 |   | 8/2001 |

OTHER PUBLICATIONS

European Search Report dated Nov. 7, 2005, directed to EP Application No. 04014285.3.

* cited by examiner

*Primary Examiner*—Cynthia Hamilton
(74) *Attorney, Agent, or Firm*—Morrison & Foerster LLP

(57) ABSTRACT

A photosensitive resin laminate comprising at least a support, a photosensitive resin layer and an IR ablation layer, wherein the IR ablation layer comprises an IR absorbent metal layer which is disposed in contact with the photosensitive resin layer.

19 Claims, 2 Drawing Sheets diameter 100 mm maximum warp

PHOTOSENSITIVE RESIN LAMINATE

TECHNICAL FIELD OF THE INVENTION

The present invention relates to a photosensitive resin laminate. More particularly, this invention relates to a photosensitive resin laminate used for producing a printing plate, a relief plate and the like by a computer plate making technique.

BACKGROUND OF THE INVENTION

In the field of relief printing such as letter press, flexo and the like, a computer plate making technique (computer to plate (CTP) technique), also known as a digital image formation technique, is becoming extremely general nowadays. In the CTP technique, a photographic mask (also called a photomask or negative film) conventionally used for covering an area unwanted to be polymerized on a photosensitive printing plate has been replaced by a mask formed and integrated within the printing plate. There are two techniques in the market as a method to obtain such integrated mask. One is a method to print a mask on a photosensitive plate by an inkjet printer, and the other is a method to form a mask by forming, on a photosensitive layer, a layer substantially non-transparent to ultraviolet rays (UV) (i.e., substantially blocks ultraviolet rays), and ablatable by irradiation of IR laser (this layer is generally referred to as an "IR ablation layer" etc. and is referred to as an "IR ablation layer" in the present specification), and forming an image on this layer with an IR laser. Using these techniques, an image (mask) is directly formed on a plate, and ultraviolet rays are irradiated through this image (mask) in the next step to afford plate making.

The CTP technique is convenient in that it does not require a negative film and can afford a resolution far higher than that by a conventional technique using a negative film. There is a detailed discussion on the superiority of the CTP technique to conventional technique.

In a photosensitive plate having the above-mentioned IR ablation layer, the IR ablation layer is generally made from a composition containing a polymer binder containing carbon black in a large amount (e.g., Japanese Patent No. 2916408 (page 1, claims)). In general, a cover film is formed on an IR ablation layer for protection of the IR ablation layer during preservation of the plate and handling thereof, and this cover film is removed before irradiation of IR laser or after irradiation of IR laser (generally after main exposure and before development). As a result of the investigation made by the present inventors and the like, however, it has been found that an IR ablation layer gets broken (damaged) or scratched when cover film is peeled off, which exerts an adverse influence on the finally obtained printing image. In addition, printing cost becomes higher because carbon black in the IR ablation layer transfers to and stain a developer during developing with the developer after a main exposure (irradiation of ultraviolet rays) after IR ablation, which necessitates exchange of the developer each time a plate is made.

SUMMARY OF THE INVENTION

In view of the above, it is therefore an object of the present invention to provide a photosensitive resin laminate that affords printing images of a higher quality than conventional ones and that reduces staining of a developer due to development.

It has been found according to the present invention that, by employing a constitution wherein an IR ablation layer comprises a metal layer containing an IR absorbent metal (hereinafter to be also referred to as an "IR absorbent metal layer") and the metal layer is disposed in contact with the photosensitive resin layer, the above-mentioned problem can be resolved, a high quality printing image can be obtained and the stain of a developer can be reduced.

Therefore, the present invention relates to the following.

(1) A photosensitive resin laminate comprising at least a support, a photosensitive resin layer and an IR ablation layer, wherein the IR ablation layer comprises an IR absorbent metal layer which is disposed in contact with the photosensitive resin layer.

(2) The photosensitive resin laminate of the above-mentioned (1), wherein the IR ablation layer comprises the IR absorbent metal layer and an organic polymer layer laminated on said metal layer.

(3) The photosensitive resin laminate of the above-mentioned (1), wherein the IR ablation layer has a thickness of 70–20000 Å.

(4) The photosensitive resin laminate of the above-mentioned (1), wherein the IR absorbent metal layer is an aluminized layer.

(5) The photosensitive resin laminate of the above-mentioned (2), wherein the organic polymer layer laminated on the metal layer is a non-IR-sensitive polymer resin layer.

(6) The photosensitive resin laminate of the above-mentioned (2), wherein the organic polymer layer laminated on the metal layer can receive an opaque non-transparent to actinic radiation.

(7) The photosensitive resin laminate of the above-mentioned (2), wherein the organic polymer layer laminated on the metal layer contains a UV absorbent.

(8) The photosensitive resin laminate of the above-mentioned (1), wherein the IR ablation layer has an optical density of not less than 2.0.

(9) The photosensitive resin laminate of the above-mentioned (1), which shows a rate of change in the radius of a halftone dot after IR ablation of not more than ±30% per unit energy ($J/cm^2$).

(10) The photosensitive resin laminate of the above-mentioned (1), which is a photosensitive plate.

(11) The photosensitive resin laminate of the above-mentioned (1), which is a photosensitive flexo plate.

(12) The photosensitive resin laminate of the above-mentioned (11), wherein wrinkles are not caused when a bending radius is not more than 5 cm.

(13) The photosensitive resin laminate of the above-mentioned (11), wherein the IR ablation layer comprises the IR absorbent metal layer and an organic polymer layer laminated on said metal layer, said organic polymer layer being a non-IR-sensitive polymer resin layer and the non-IR-sensitive polymer resin layer comprising a water-soluble polymer and a plasticizer.

(14) The photosensitive resin laminate of the above-mentioned (1), wherein the photosensitive resin laminate is a photosensitive letter press plate.

(15) The photosensitive resin laminate of the above-mentioned (14), wherein the photosensitive resin layer comprises a composition containing a polymer binder, an ethylenically unsaturated compound and a photoinitiator, the photosensitive resin laminate shows a rate of warp of within ±2% before exposure to actinic radiation, and a change in the warp after exposure to actinic radiation is not more than 15%.

(16) The photosensitive resin laminate of the above-mentioned (14), wherein the photosensitive resin layer has a residual solvent content of 3–10%.

(17) A photosensitive resin laminate comprising at least a support, a photosensitive resin layer and an IR ablation layer, wherein the IR ablation layer comprises an IR absorbent metal layer and a UV absorbent organic polymer layer on at least one surface of the metal layer.

DETAILED DESCRIPTION OF THE INVENTION

In the following, the present invention is explained in detail.

The photosensitive resin laminate of the present invention comprises at least a support, a photosensitive resin layer and an IR ablation layer, wherein the IR ablation layer comprises an IR absorbent metal layer and the metal layer is disposed in contact with the photosensitive resin layer.

Figure 1:
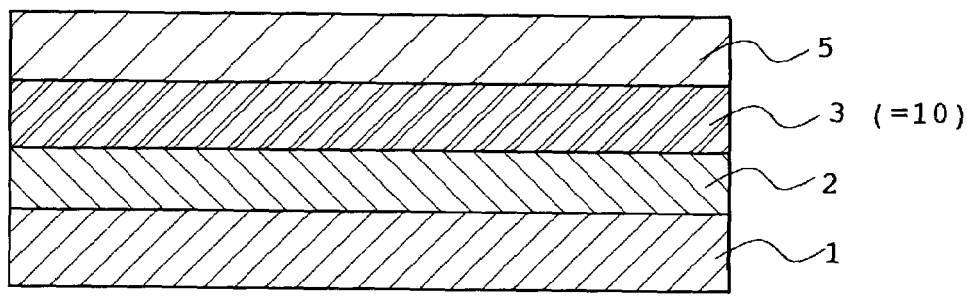
FIG. 1 is a schematic cross section of a first embodiment of the photosensitive resin laminate of the present invention.
Figure 2:
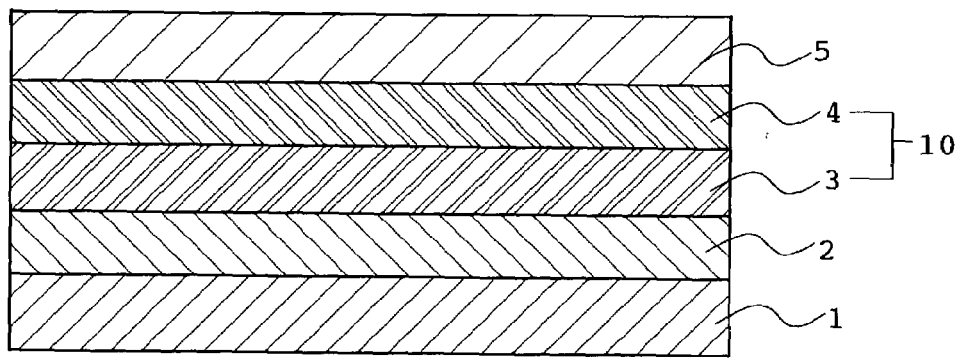
FIG. 2 is a schematic cross section of a second embodiment of the photosensitive resin laminate of the present invention.
Figure 3:
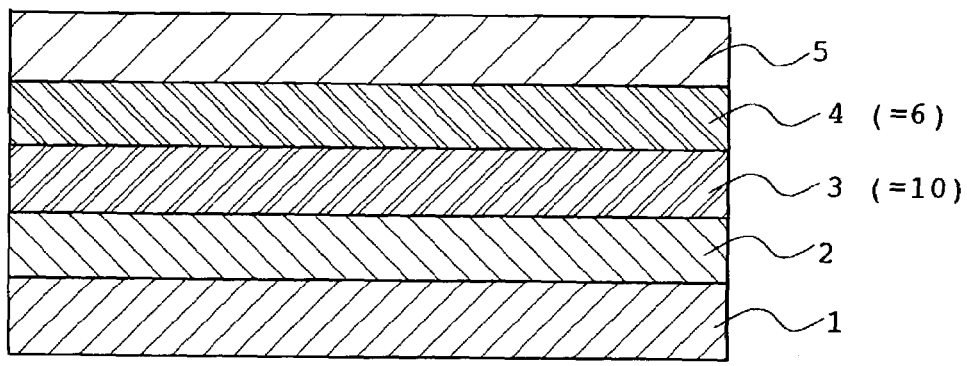
FIG. 3 is a schematic cross section of a third embodiment of the photosensitive resin laminate of the present invention.
Figure 4:
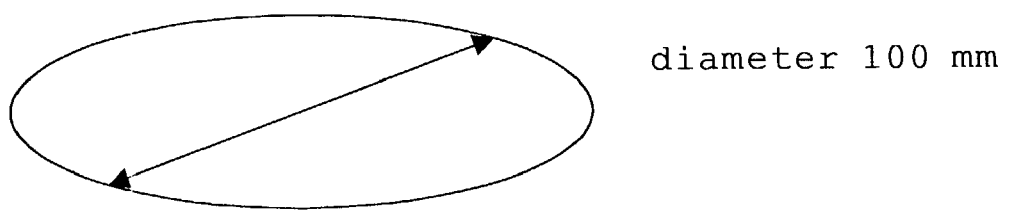
FIG. 4 is an explanatory schematic view of a rate of warp measurement sample.
Figure 5:
FIG. 5 is an explanatory schematic view of a rate of warp measurement sample.

FIGS. 1, 2 and 3 show examples of the laminate structure of the photosensitive resin laminate of the present invention. FIG. 1 shows a constitution wherein a support 1, a photosensitive resin layer 2, an IR absorbent metal layer 3 and a cover film 5 are successively laminated, and FIG. 2 shows a constitution wherein a support 1, a photosensitive resin layer 2, an IR absorbent metal layer 3, an organic polymer layer 4 and a cover film 5 are successively laminated. FIG. 3 shows a constitution wherein the organic polymer layer 4 in FIG. 2 is a non-IR sensitive polymer resin layer 6, or a constitution wherein a support 1, a photosensitive resin layer 2, an IR absorbent metal layer 3, a non-IR sensitive polymer resin layer 6 and a cover film 5 are successively laminated.

In the example of FIGS. 1, 2 and 3, an IR ablation layer 10 is made only of the IR absorbent metal layer 3, and in the example of FIG. 2, an IR ablation layer 10 is made only of two layers of the IR absorbent metal layer 3 and the organic polymer layer 4 formed thereon.

In the photosensitive resin laminate of the present invention, as show in the examples of the above-mentioned FIG. 1, FIG. 2 and FIG. 3, the IR ablation layer 10 includes the IR absorbent metal layer 3. As a result, the IR ablation layer 10 has high film strength, and does not easily suffer from breakage or flaws even when a cover film 5 is peeled off. Furthermore, because the IR absorbent metal layer 3 is disposed in contact with the photosensitive resin layer 2 (directly laminated) and another layer (organic polymer layer or a layer having a composition containing an organic polymer) is not disposed between the IR absorbent metal layer 3 and the photosensitive resin layer 2. As a result, the IR ablation layer resists breakage and the relief obtained by main exposure and development after IR ablation can have a sufficiently high resolution.

The embodiment shown in FIG. 1 has a preferable constitution in view of the sensitivity (i.e., shortness of time of ablation upon absorption of IR) of the IR ablation layer 10 during exposure to light. The embodiment shown in FIG. 2 has a preferable constitution in view of the function and strength of the IR ablation layer 10 as a mask after IR ablation.

In the present invention, the above-mentioned FIG. 1, FIG. 2 and FIG. 3 are mere examples, and as long as the aforementioned characteristics (or the constitution wherein the IR ablation layer includes an IR absorbent metal layer and the IR absorbent metal layer is disposed in contact with the photosensitive resin layer) are attained, any known techniques of this kind for photosensitive resin laminate can be applied to other parts.

In the present invention, by the "IR absorbent metal" is meant a metal, an alloy or a metal-containing compound capable of being ablated upon absorption of IR, wherein the alloy here includes not only a melt product of two or more kinds of metal elements but a melt product containing two or more kinds of metal elements as well as an element other than the metal elements. The "IR absorbent metal" may be one kind of material or a combination of two or more kinds of materials.

Preferable examples of the above-mentioned metal include Al, Zn and Cu. Preferable examples of the above-mentioned alloy include an alloy of two or more kinds of metals selected from Al, Ca, Sc, Tl, V, Sb, Cr, Mn, Fe, Co, Ni, Cu, Zn, Y, Zr, Nb, Mo, Ag, In, Sn, Ta, W, Au, Bi and Pb, and an alloy containing, along with the two or more kinds of metals, a non-metal element (carbon, silicon etc.) and/or a rare-earth element (Nd, Sm, Gd, Tb etc.). As the metal-containing compound, various compounds of metal oxide, metal nitride and the like can be used, as long as they absorb IR and are ablated. Of those, dark inorganic pigments such as copper chromite, chromic oxide, cobalt aluminate-chrome and the like are preferable.

For prevention of breakage and flaws (film strength) of the IR ablation layer, the IR absorbent metal is preferably a metal or an alloy, particularly preferably Al, Zn, Cu and a Bi—In—Cu alloy, particularly preferably Al. In a preferable embodiment of the present invention, the IR absorbent metal layer is an aluminized layer.

In the present invention, the IR ablation layer does not substantially allow transmission of ultraviolet rays (actinic radiation). That is, an optical density for ultraviolet rays (actinic radiation) exceeds 2.0, preferably over 2.5, and more preferably over 3.0.

When the optical density is less than 2.0, the masked part is cured by UV leak during main exposure, converting originally a non-image part to an image area, which unpreferably results in, what is called, a fogging phenomenon.

To meet the aforementioned optical density, the IR absorbent metal layer 3 preferably has a thickness of 70–20000 Å, more preferably 100–8000 Å, particularly preferably 100–5000 Å. When the thickness is less than 70 Å, masking function after IR ablation becomes unpreferably low, and when it exceeds 20000 Å, IR for image formation unpreferably fails to cause ablation.

In contrast, as described in the following, when the IR ablation layer consists of the IR absorbent metal layer 3 and the organic polymer layer 4 laminated on the metal layer, the IR absorbent metal layer preferably has a thickness of 50–15000 Å, more preferably 70–8000 Å, particularly preferably 100–5000 Å. When the thickness is less than 50 Å masking function after IR ablation becomes unpreferably low, and when it exceeds 15000 Å, IR for image formation unpreferably fails to cause ablation.

The above-mentioned IR ablation layer may include an IR absorbent metal layer and the organic polymer layer laminated on the metal layer.

Examples of the polymer of the organic polymer layer in the present invention include polyamide, polyethylene, polypropylene, polyester, rubbers, epoxy compound, polyvinyl alcohol, polyacrylic acid, polyethylene oxide, amphoteric interpolymer, alkylcellulose, cellulose polymer (particularly hydroxypropyl cellulose, hydroxyethyl cellulose, nitrocellulose), copolymer of ethylene and vinyl acetate, cellulose acetate butyrate, polybutyral and the like. They may be used alone or in combination of two or more kinds thereof. In the present invention, the polymer of the above-mentioned organic polymer layer is preferably water-soluble. The amphoteric interpolymer is described in U.S. Pat. No. 4,293,635.

As the polymer of the above-exemplified polymers, polyvinyl alcohol, modified polyvinyl alcohol, polyacrylic acid, polyethylene oxide are used in the present invention in view of the developability in water or an aqueous medium, occurrence of wrinkles and the like. Of these, polyvinyl alcohol or modified polyvinyl alcohol having a degree of polymerization of 500–4000, preferably 1000–3000, and a degree of saponification of 70%–99%, preferably 80–99%, more preferably 80–90%, is used. As used herein, by the modified polyvinyl alcohol means one having carboxyl group, carbonyl group, polyoxyalkylene group, acetoacetyl group, sulfon group or silanol group introduced into a terminal or a main chain by secondary reaction with a compound reactive with hydroxyl group of polyvinyl alcohol (e.g., a compound having carboxyl group, double bond, aromatic ring and the like) or saponification of a copolymer of vinyl acetate and a different vinyl monomer.

The organic polymer layer of the present invention has a thickness of 0.01–200 μm, preferably 0.1–100 μm, particularly preferably 0.1–50 μm. When the thickness exceeds 200 μm, it may not be easily set on a drum for IR ablation, or the relief obtained by main exposure and development may show lower resolution, which is not preferable. The organic polymer layer 4 may contain a compound that absorbs ultraviolet rays, such as UV absorbent, metal and the like for the prevention of fogging phenomenon during main exposure.

Preferably, the above-mentioned organic polymer layer laminated on the metal layer is a non-IR-sensitive polymer resin layer.

Preferably, the above-mentioned organic polymer layer laminated on the metal layer contains a UV absorbent.

As a method for adding a UV absorbent to the organic polymer layer, there is a method comprising adding a UV absorbing substance to the organic polymer layer, a method comprising copolymerization of a reactive UV absorbing substance with a monomer to give a polymer layer and the like.

Examples of the UV absorbing substance include general UV absorbents, such as benzophenone compound, benzotriazole compound, salicylate compound, indole compound and the like. Examples of the benzophenone compound include 2,4-dihydroxybenzophenone, 2-hydroxy-4-methoxybenzophenone, 2-hydroxy-4-octoxybenzophenone, 2-hydroxy-4-benzyloxybenzophenone, 2-hydroxy-4-dodecyloxybenzophenone, 2,2'-dihydroxy-4-methoxybenzophenone, 2,2'-hydroxy-4,4'-dimethoxybenzophenone, 2-hydroxy-4-methoxy-5-sulfobenzophenone and the like. Examples of the benzotriazole compound include 2-(2'-hydroxy-5'-methylphenyl)benzotriazole, 2-(2'-hydroxy-5'-tert-butylphenyl)benzotriazole, 2-(2'-hydroxy-3',5'-ditert-butylphenyl)benzotriazole, 2-(2'-hydroxy-tert-butyl-5'-methylphenyl)-5-chlorobenzotriazole, 2-(2'-hydroxy-3',5'-ditert-butylphenyl)-5-chlorobenzotriazole, 2-(2'-hydroxy-3',5'-ditert-amylphenyl)benzotriazole, 2-(2'-hydroxy-3'-(3",4",5",6"-tetrahydrophthalimidemethyl)-5'-methylphenyl) benzotriazole and the like. Examples of the salicylate compound include phenylsalicylate, p-tert-butylphenylsalicylate, p-octylphenylsalicylate and the like. In addition, a compound having a naphthalene skeleton such as 2-hydroxy-3-naphthoic acid propylene glycol ester and the like, a compound having a anthracene skeleton such as 9-anthracenemethanol and the like, a compound having a benzothiazole skeleton such as dihydrothio-p-toluidine and the like, a compound having a quinazoline skeleton such as quinazolidinedione and the like can be also used. Furthermore, a UV absorbent polymer can be used which is obtained by copolymerization of a radical polymerizable compound such as (meth)acrylic acid ester, styrene and the like with a radically polymerizable UV absorbent having a benzophenone skeleton or a benzotriazole skeleton. An inorganic compound such as titanium oxide, cerium oxide, zinc oxide, magnesium oxide and alumina can be also used. A pigment such as toluidine red, toluidine yellow, copper phthalocyanine, quinacridone, toluidine YW, Watchung red BWC, toluidine yellow GW, monastral blue BW, monastral green BW, pigment scarlet, monastral green, monastral maroon B, monastral orange, carbon black, graphite and the like can be used. Any one of these may be used or two or more kinds thereof may be concurrently used.

The proportion of the amounts of the aforementioned UV absorbing substances is 0.1–50 wt %, preferably 0.5–40 wt %, particularly desirably 1–30 wt %, relative to the organic polymer layer. When it is less than 0.1 wt %, UV absorbency dramatically decreases unpreferably showing no effect of enlarging exposure latitude. In contrast, when it exceeds 50 wt %, the time necessary for exposure to light becomes too long, thus impairing its practical applicability, and the organic polymer layer unpreferably becomes brittle.

The optical density of the UV absorbent organic polymer layer at 365 nm is preferably 0.05–1.00. When it is less than 0.05, it is ineffective for enlarging exposure latitude, and when it is 1.00 or above, the time necessary for exposure to light becomes too long, thus impairing its practical applicability.

As mentioned below, when the photosensitive resin laminate of the present invention is a photosensitive flexo plate, in one embodiment of the present invention, the above-mentioned organic polymer layer laminated on the metal layer is a non-IR-sensitive polymer resin layer, and the non-IR-sensitive polymer resin layer contains a water-soluble polymer and a plasticizer. The above-mentioned water-soluble polymer may be a copolymer with a substance having plasticity (plasticizer).

Examples of the water-soluble polymer are those recited above. As the plasticizer, any plasticizer generally usable for water-soluble polymer resins can be used. Examples of such plasticizer include alkylene glycols such as ethylene glycol, trimethylene glycol, tetramethylene glycol, propylene glycol, pentamethylene glycol, hexylene glycol, hexamethylene glycol and the like, polyalkylene glycols such as diethylene glycol, dipropylene glycol, triethylene glycol, tetraethylene glycol, polyethylene glycol #200, polyethylene glycol #300, polyethylene glycol #400, polyethylene glycol #600, polyethylene glycol #1000, polyethylene glycol #2000, polyethylene glycol #4000, a copolymer of polyethylene glycol and polypropylene glycol, and the like, butanediols such as 2,3-butanediol, 1,3-butanediol and the like, polyhydric alcohols such as alcohols of trivalent or more (e.g., glycerine, sorbitol, pentaerythritol, trimethylolpropane etc.) and the like, ethanolamines such as monoethanolamine, diethanolamine, triethanolamine and the like, amine compounds such as N-methylpyrrolidone, cyclohexylamine, urea and the like. Of these, polyethylene glycol, a copolymer of polyethylene glycol and polypropylene glycol, propylene glycol and glycerine are preferable. Particularly preferred is a copolymer of polyethylene glycol and polypropylene glycol. The amount of the copolymer of polyethylene glycol and polypropylene glycol is preferably 1–100 parts by weight per 100 parts by weight of the water-soluble polymer resin. When it is less than 1 part by weight, adhesion between a polymer resin layer formed by coating an aqueous solution of the polymer resin of the present invention to a support such as a polyester film and the like, and the aforementioned support temporarily becomes too high to make their release difficult. In addition, plasticity becomes insufficient. When it is 100 parts by weight or above, a copolymer of polyethylene glycol and polypropylene glycol bleeds out on the coated surface and forms a blocking when an aqueous solution of the polymer resin of the present invention is coated and dried. It is also possible to use a mixture of two kinds of more of the components in a different combination.

The photosensitive resin layer 2 of the present invention is a layer of a composition containing at least a known soluble synthetic polymer compound (polymer binder), a photopolymerizable unsaturated compound (hereinafter to be also referred to as a crosslinking agent) and a photopolymerization initiator, or a layer of a composition containing at least an elastomer binder, a polymerizable compound (hereinafter to be also referred to as a crosslinking agent) and a photoinitiator, wherein the composition is generally about 5–150 parts by weight of a polymerizable compound, and about 0.1–10 parts by weight of a photoinitiator, relative to 100 parts by weight of the polymer. Furthermore, an additive such as a plasticizer, a thermal polymerization inhibitor, a dye, a pigment, a UV absorbent, a flavoring or an antioxidant may be contained. A photosensitive resin layer used for relief printing plate such as known letter press and flexo and the like may be applied directly. It may be a single layer or a laminate of two or more layers having different compositions.

The polymer used for letter press can contain a known synthetic polymer binder that can be dissolved or dispersed in water or a mixture of water and alcohol. For example, polyetheramide (JP-A-55-79437 and the like), polyether esteramide (JP-A-58-113537 and the like), tertiary nitrogen-containing polyamide (JP-A-50-76055 and the like), ammonium salt type tertiary nitrogen atom-containing polyamide (JP-A-53-36555 and the like), addition polymer of amide compound having one or more amide bonds and organic diisocyanate compound (JP-A-58-140737 and the like), addition polymer of diamine without amide bond and organic diisocyanate compound (JP-A-4-97154 and the like) and the like are mentioned. Of these, tertiary nitrogen atom-containing polyamide and ammonium salt type tertiary nitrogen atom-containing polyamide are preferable.

The polymer used for flexo may be a single polymer or a polymer mixture. It may be a hydrophobic polymer, a hydrophilic polymer or a mixture of a hydrophobic polymer and a hydrophilic polymer. Preferable examples of the hydrophobic polymer include butadiene rubber, isoprene rubber, 1,2-polybutadiene, styrene-butadiene rubber, chloroprene rubber, nitrile-butadiene rubber, styrene-butadiene-styrene block copolymer, styrene-isoprene-styrene block copolymer, butyl rubber, ethylene-propylene rubber, chlorosulfonated polyethylene, butadiene-(meth)acrylic acid ester copolymer, acrylonitrile-(meth)acrylic acid ester copolymer, epichlorohydrin rubber, chlorinated polyethylene, silicone rubber and urethane rubber, which may be used alone or in combination of two or more kinds thereof. Preferable examples of the hydrophilic polymer include one having a hydrophilic group, such as —COOH, —COOM (M is monovalent, divalent or trivalent metal ion or substituted or non-substituted ammonium ion), —OH, —NH$_2$, —SO$_3$H, phosphoric acid ester group and the like, which is specifically polymers of (meth)acrylic acid or a salt thereof, copolymers of (meth)acrylic acid or a salt thereof and alkyl (meth)acrylate, copolymers of (meth)acrylic acid or a salt thereof and styrene, copolymers of (meth)acrylic acid or a salt thereof and vinyl acetate, copolymers of (meth)acrylic acid or a salt thereof and acrylonitrile, polyvinyl alcohol, carboxymethyl cellulose, polyacrylamide, hydroxyethyl cellulose, polyethylene oxide, polyethyleneimine, polyurethane having —COOM group, polyureaurethane having —COOM group, polyamic acid having —COOM group and salts thereof or derivatives thereof, which may be used alone or in combination of two or more kinds thereof.

The photopolymerizable unsaturated compound preferably used in the present invention is exemplified by ethylenically unsaturated compounds, such as ring opening addition reaction products (e.g., polyglycidylether of polyhydric alcohol with methacrylic acid and acrylic acid). Examples of the aforementioned polyhydric alcohol include but not limited to dipentaerythritol, pentaerythritol, trimethylolpropane, glycerine, ethylene glycol, diethylene glycol, triethylene glycol, ethylene oxide adduct of phthalic acid, acrylic acid adducts of diglycidylether of bisphenol A and bisphenol F, and the like. These compounds can be used in a mixture of two or more kinds thereof. Of these, trimethylolpropane is preferable.

When the soluble synthetic polymer compound is an elastomer binder, preferable polymerizable compound is a polymerizable ethylenically mono- or poly-unsaturated organic compound that can be used for the production of a photosensitive printing plate and is compatible with a polymer. Examples of the compound include styrene, vinyltoluene, t-butylstyrene, α-methylstyrene, acrylonitrile, (meth) acrylic acid, methyl(meth)acrylate, ethyl(meth)acrylate, n-propyl(meth)acrylate, iso-propyl(meth)acrylate, n-butyl (meth)acrylate, iso-butyl(meth)acrylate, sec-butyl(meth) acrylate, t-butyl(meth)acrylate, 2-ethylhexyl(meth)acrylate, n-decyl(meth)acrylate, lauryl(meth)acrylate, n-tridecyl (meth)acrylate, stearyl(meth)acrylate, ethylene glycol mono (meth)acrylate, propylene glycol mono(meth)acrylate, diethylene glycol mono(meth)acrylate, dipropylene glycol mono(meth)acrylate, polyethylene glycol mono(meth)acrylate, polypropylene glycol mono(meth)acrylate, polyethylene glycol monomethylether mono(meth)acrylate, polypropylene glycol monomethylether mono(meth)acrylate, polyethylene glycol monoethylether mono(meth)acrylate, polypropylene glycol monoethylether mono(meth)acrylate, n-butoxyethyl(meth)acrylate, phenoxyethyl(meth)acrylate, 2-phenoxypropyl(meth)acrylate, cyclohexyl(meth)acrylate, tetrahydrofurfuryl(meth)acrylate, glycidyl(meth)acrylate, allyl(meth)acrylate, benzyl(meth)acrylate, tribromophenyl (meth)acrylate, 2,3-dichloropropyl(meth)acrylate, 3-chloro-2-hydroxypropyl(meth)acrylate, N,N-diethylaminoethyl (meth)acrylate, N,N-dimethylaminoethyl(meth)acrylate, N-t-butylaminoethyl(meth)acrylate, acrylamide, N,N-dimethylacrylamide, N,N-diethylacrylamide, ethylene glycol di(meth)acrylate, diethylene glycol di(meth)acrylate, polyethylene glycol di(meth)acrylate, propylene glycol di(meth)acrylate, dipropylene glycol di(meth)acrylate, polypropylene glycol di(meth)acrylate, 1,3-butyleneglycol (meth) acrylate, 1,4-butanediol (meth)acrylate, neopentylglycol di(meth)acrylate, 1,6-hexanediol di(meth)acrylate, 1,9-nonanediol di(meth)acrylate, 1,10-decanediol di(meth)acrylate, 1,12-dodecanediol di(meth)acrylate, 1,14-tetradecanediol di(meth)acrylate, pentaerythritol di(meth)acrylate, pentaerythritol tri(meth)acrylate, pentaerythritol tetra(meth)acrylate, glycelol di(meth)acrylate, glycelol allyloxy di(meth)acrylate, trimethylolethane di(meth)acrylate, trimethylolethane tri(meth)acrylate, trimethylolpropane di(meth)acrylate, trimethylolpropane tri(meth)acrylate, dicyclopentyldimethylene di(meth)acrylate, dicyclopentadecane di(meth)acrylate, tricyclodecanediyldimethyl di(meth)acrylate, triallylcyanurate, triallylisocyanurate, triallyltrimellitate, diallylphthalate, divinylbenzene, polyurethane (meth)acrylate, polyester (meth)acrylate, oligobutadiene (meth)acrylate, oligoisoprene (meth)acrylate, oligopropylene (meth)acrylate and the like, which may be used alone or in combination of two or more kinds thereof.

Preferable examples of the photoinitiator include benzophenones, benzoins, acetophenones, benzyls, benzoin alkylethers, benzylalkylketals, anthraquinones, thioxanthones and the like, which are specifically benzophenone, chlorobenzophenone, benzoin, acetophenone, benzyl, benzoin methylether, benzoin ethylether, benzoin isopropyl ether, benzoin isobutylether, benzyldimethylketal, benzyldiethylketal, benzyldiisopropylketal, anthraquinone, 2-ethylanthraquinone, 2-methylanthraquinone, 2-allylanthraquinone, 2-chloroanthraquinone, thioxanthone, 2-chlorothioxanthone and the like, which may be used alone or in combination of two or more kinds thereof.

The photosensitive resin layer in the present invention may contain, besides the polymer, the polymerizable compound and the photoinitiator, an additive such as a plasticizer, a thermal polymerization inhibitor, a dye, an antioxidant and the like.

The photosensitive resin layer can be prepared into a layer soluble or dispersible in a water-soluble developer, a semi-water-soluble developer and an organic solvent developer by appropriately changing the materials of each component. It is preferably made to be developable in water or an aqueous medium. When preparing a photosensitive resin layer that can be developed in water or an aqueous medium, it preferably corresponds to the photosensitive resin layer specifically described in EP-A767407, JP-A-60-211451, JP-A-2-175702, JP-A-4-3162, JP-A-2-305805, JP-A-3-228060, JP-A-10-339951 and the like.

As mentioned below, when the photosensitive resin laminate of the present invention is a photosensitive letter press plate, in one embodiment of the present invention, the photosensitive resin layer has a residual solvent content of 3–10%, preferably 4–7%. When the residual solvent content is less than 3%, flowability during forming is degraded, which prevents delivery from a concentration machine or forming in a desired thickness. When the residual solvent content exceeds 10%, exposure of a photosensitive plate to actinic radiation without depressurization unpreferably causes inward curling during light exposure, which prevents uniform irradiation.

The residual solvent of a photosensitive resin layer in the present invention mainly consists of water and lower aliphatic alcohol, whose content is measured by the method to be mentioned below.

Examples of the aforementioned lower aliphatic alcohol include methyl alcohol, ethyl alcohol, propyl alcohol, isopropyl alcohol, ethylene glycol, ethylene glycol monomethylether and the like, and mixtures thereof. In view of handling property during production and the like, methyl alcohol and ethyl alcohol are preferably used.

When the photosensitive resin laminate of the present invention is a photosensitive letter press plate, the residual solvent component of the photosensitive resin layer of the present invention, the ratio of lower aliphatic alcohol and water is preferably 2/8–8/2, desirably 3/7–7/3. When the proportion of water exceeds 80%, concentration requires time and productivity is degraded. When it is less than 20%, a soluble synthetic polymer compound tends to show poor dissolution property and the dissolution time unpreferably becomes longer.

The support in the present invention is preferably a material having flexibility and superior in dimensional stability, and examples thereof include a film of metal such as steel, aluminum, copper, nickel and the like, a plastic film such as polyethylene terephthalate, polyethylene naphthalate, polybutylene terephthalate, polycarbonate and the like. Of these, polyethylene terephthalate film is used as a support material superior in dimensional stability and flexibility. The support used here desirably has a thickness of 50–350 µm, preferably 100–250 µm, in view of mechanical property, shape stability and handling property during printing plate making and the like. When the thickness is not more than 50 µm, the support itself is subject to deformation such as bending and the like, and a thickness of not less than 350 µm degrades flexibility to unpreferably cause lower fitting property to a cylinder during IR ablation. Where necessary, a generally used adhesive may be formed to improve adhesion between a support and a photosensitive resin layer.

It is also possible to laminate a cover film on the photosensitive resin laminate of the present invention. The cover film is formed to protect an IR ablation layer during storage and handling of the plate and removed (peeled off) before IR irradiation or after IR irradiation. In the plate of the present invention, breakage and flaws of IR ablation layer can be prevented during removal of the cover film or a peeling off operation.

The cover film 5 preferably consists of materials of polyamide; polyvinyl alcohol; copolymer of ethylene and vinyl acetate; amphoteric interpolymer; cellulose polymers such as hydroxyalkylcellulose and cellulose acetate; polybutyral; cyclic rubber, polyethylene, polypropylene, polyethylene terephthalate, polyethylene-2,6-naphthalate, nylon 6, nylon 4, nylon 66, nylon 12, polyvinyl chloride, polyvinylidene chloride, full aromatic polyamide, polyamideimide, polyimide, polyetherimide, polysulfone, polyphenylene sulfide, polyphenylene oxide and the like. As used herein, the amphoteric interpolymer is described in U.S. Pat. No. 4,293,635. These materials may be used alone or in combination of two or more kinds thereof. Besides these, a small amount of a different organic polymer may be copolymerized or blended. In addition, self-oxidative compounds such as nitrocellulose and nitroglycerine; non-self oxidative polymers such as alkylcellulose (e.g., ethylcellulose), polyacrylic acid and alkali metal salt thereof; polyacetal; polyimide; polycarbonate; polyester; polyalkylene such as polyethylene and polybutylene; polyphenylene ether; polyethylene oxide; polylactone; combinations thereof and the like can be also used.

The cover film 5 may be removed before IR irradiation or after IR irradiation (present during IR irradiation).

The cover film 5 preferably has a thickness of 10–300 μm, particularly preferably 10–200 μm.

In the present invention, a release layer may be present between a cover film and an IR ablation layer. The material of the release layer is preferably silicone release agent, fluorine resin, stearic acid resin, polyethylene wax, liquid paraffin and the like, and its thickness is preferably about 0.001–10 μm, particularly preferably 0.001–5 μm.

In one embodiment of the present invention, a rate of change in the radius of a halftone dot after IR ablation per unit energy (J/cm$^2$) is not more than ±30%.

In the present invention, the "rate of change in the radius of a halftone dot after IR ablation" is defined by the following formulas:

$A>B$ rate of change (%)=$(A-B)/B \times (D-C) \times 100$ $B>A$ rate of change (%)=$(A-B)/A \times (D-C) \times 100$ wherein a halftone dot radius when a certain value (D) of laser energy is irradiated is (A), and the halftone dot radius when a laser energy value is changed to an optional value (C) is (B).

In the present invention, a rate of change in the radius of a halftone dot per energy variation (J/cm$^2$) of IR laser is preferably not more than ±30%, more preferably not more than ±25%, still more preferably not more than ±20%, according to the aforementioned definition. When the aforementioned rate of change exceeds ±30%, the halftone dot size after ablation changes more than a theoretical halftone dot size in response to changes in laser illuminance. For example, when it is less than −30%, the highlight halftone dots become too fine and are mechanically removed during development, or they collapse during printing, which in turn results in a failure to form sharp images. When it exceeds +30%, the highlight halftone dots conversely become too thick to unpreferably make the halftone part darker (dot gain) during printing.

In one embodiment of the present invention, the bending radius for occurrence of wrinkles is not more than 5 cm.

In the present invention, by the "bending radius for occurrence of wrinkles" is meant a minimum radius that is free of wrinkles or cracks on the plate surface when a plate (photosensitive resin laminate) is wound around a cylindrical metal drum having a different radius of curvature, taken off and placed on a planar surface, which is measured by the following method.

(Measurement Method of Bending Radius when Wrinkles Occur)

Six kinds of cylindrical metal drums having a radius of curvature of from 3 cm to 13 cm at 2 cm intervals were prepared and a plate (photosensitive resin laminate) was wound around each cylindrical metal drum with an IR absorbent metal layer on the outside, taken off and placed on a planar surface. The surface of the plate was observed with a loupe (×10 magnification) and bending radius upon occurrence of wrinkles was determined.

In one embodiment of the present invention, the rate of warp before exposure to actinic radiation of the photosensitive resin laminate is within ±2% and this value changes by not more than 15% after exposure of the photosensitive resin laminate to actinic radiation.

In the "rate of warp" in the present invention, a concave or convex change in the direction parallel to a side is referred to as a warp and expressed in a percentage of the maximum warp relative to the length of 100 mm. The concave is expressed in minus and the convex is expressed in plus. The change in the rate of warp means an absolute value of difference in the rate of warp before and after exposure to actinic radiation.

For the measurement of the rate of warp in the present invention, a photosensitive resin laminate having a diameter of 100 mm is measured for the rate of warp before exposure to actinic radiation after removing a protective film and the like, if such is on the IR ablation layer, to completely expose the IR ablation layer. Thereafter, 650 mJ actinic radiation is shot to the entire surface and the rate of warp is measured. The difference before and after the irradiation is calculated.

In the present invention, when the rate of warp exceeds ±2% and when a photosensitive plate is placed on a light exposure machine without a decompression sheet, uniform irradiation at the time point when the plate is exposed to actinic radiation is not attainable. When changes in the rate of warp before and after the exposure to actinic radiation exceeds 15%, the photosensitive plate warps greatly during exposure to actinic radiation, which in turn causes inconsistent irradiation onto the plate and expression of lower resolution.

The method for preparing a photosensitive resin laminate of the present invention is not particularly limited but generally, a photosensitive resin layer is formed on a support by applying, spray coating and the like to give one of the two laminates, or a protective film is peeled off from a commercially available photosensitive printing plate to give one laminate. Separately, an organic polymer layer is formed by applying, spray coating and the like on a substrate film (cover film), then forming an IR absorbent metal layer by vacuum deposition, sputtering and the like to give the other laminate. The thus-obtained two laminates are laminated using a heat press machinery and the like. The laminating conditions are temperature: room temperature to 150° C., preferably 50–120° C., pressure: 20–200 kg-weight/cm$^2$, preferably 50–150 kg-weight/cm$^2$.

The use of the photosensitive resin laminate of the present invention is not particularly limited and is exemplified by plate for printing, sign plate, plate for forming mother die, mask material for flexible printed circuit and the like. The plate for printing includes, for example, flexo plate, letter press plate, plate for pad printing (plate for intaglio printing), plate for screen printing, plate for lithographic printing and the like. In one embodiment of the present invention, the above-mentioned photosensitive resin laminate is a photosensitive plate.

In one embodiment of the present invention, the above-mentioned photosensitive resin laminate is a photosensitive flexo plate or photosensitive letter press plate.

The photosensitive resin laminate of the present invention has at least a support, a photosensitive resin layer and an IR ablation layer, wherein the IR ablation layer contains an IR absorbent metal layer and the metal layer has a UV absorbent organic polymer layer on at least one surface.

Preferable embodiments of the above-mentioned support, photosensitive resin layer, IR ablation layer, IR absorbent metal layer and UV absorbent organic polymer layer are as described in the above.

A printing plate or a relief plate can be prepared from a photosensitive plate as in the following.

After a cover film is or is not peeled off, an ablation layer is exposed to IR laser image for IR ablation, whereby a mask is formed on a photosensitive resin layer. Examples of suitable IR laser include ND/YAG laser (1064 nm) and diode laser (e.g., 830 nm). A laser system suitable for a computer plate making technique is commercially available, and exemplified by Cyrel Digital Imager Spark (manufactured by BARCO), diode laser system OmniSetter (registered trademark) (laser wavelength: 830 nm; drum axis: 1800 mm) and ND/YAG laser system Digilas (registered trademark). These include a rotary cylindrical drum to support a photosensitive plate, an IR laser irradiation apparatus and a layout computer. The image information is directly transmitted from the layout computer to the laser apparatus.

After writing the mask on the IR ablation layer as mentioned above, the photosensitive plate is entirely exposed to actinic radiation through the mask. This is advantageously done directly on the laser cylinder. Alternatively, the plate may be removed from the laser apparatus and exposed to actinic radiation on a conventional flat irradiation unit. During the irradiation step, the photosensitive resin layer polymerizes in the area exposed in the above-mentioned mask forming step (ablation step) and otherwise in the IR ablation layer area which is covered with the IR ablation layer non-transparent to irradiation light. The actinic radiation may be applied in a conventional vacuum frame without oxygen. It may be also applied in the presence of atmospheric oxygen.

When an image written by IR laser needs modification before the above-mentioned exposure of the entire surface to actinic radiation in the present invention, an opaque is applied onto the polymer resin layer to enable easy modification of the image. In one embodiment of the present invention, an organic polymer layer laminated on the metal layer can receive an opaque non-transparent to the actinic radiation. The opaque in the present invention is a substance that substantially prevents transmission of ultraviolet rays (actinic radiation). Examples thereof include oil-based ink, water-based ink, light blocking opaque tape and the like. Preferred is one having an optical density of not less than 2.0 for actinic radiation.

After exposure to actinic radiation as mentioned above, the plate is subjected to development. The development step can be performed using a conventional development unit, and depending on the properties of the plate, water, an organic solvent or a mixture thereof can be used. During the development, non-polymerized area of the photosensitive resin layer and the remaining part of the IR ablation layer are removed. It is possible to first remove the IR ablation layer with one kind of a solvent or a solvent mixture and develop the photosensitive resin layer with a different developer. After the development step, the obtained printing plate is dried. The drying conditions of the plate are, for example, 45–80° C. for 15 min–4 hr, 60–70° C. for 5 min–60 min and the like. After drying, some post-treatments may be performed. For example, to make a printing plate non-adhesive, irradiation with a germicidal lamp or a treatment with $Br_2$ may be applied.

EXAMPLES

The present invention is explained in detail by referring to Examples, Comparison Reference Example and Comparative Examples. The examples are mere exemplifications and do not limit the present invention in any way.

(Optical Density (OD))

Measured using a black and white transmission densitometer DM-520 (DAINIPPON SCREEN MFG. CO., LTD.).

(IR Irradiation Energy)

IR-Energy $(J/cm^2) = W/((R/60) \times D \times L)$ wherein W is a laser output (watt), R is the number of rotation (rpm), D is an IR beam diameter (cm), and L is a peripheral length (cm) of a drum.

Evaluation of warp: A sample was prepared by the aforementioned method and exposed to light using an exposure device (manufactured by NIHON DENSHI SEIKI CO., LTD.) containing a lamp having an illuminance of 20–30 $w/m^2$ (manufactured by Mitsubishi Electric Corporation). The warp before and after the exposure was measured and changes in the warp were calculated.

(Preparation of Deposition Sheet)

Reference Example 1

An aqueous solution of polyvinyl alcohol (GOHSENOL GH-20 manufactured by NIPPON SYNTHETIC CHEMICAL INDUSTRY CO., LTD.: degree of saponification: 88%)/propylene glycol (manufactured by ASAHI DENKA Co., Ltd.)/surfactant (EPAN 740 manufactured by Dai-ichi Kogyo Seiyaku Co., Ltd.)/pure water=8.75 g/8.75 g/0.01 g/332.5 g was applied to a PET film (whole cloth was manufactured by Toyo Boseki Kabushiki Kaisha, E5002, thickness 125 µm), that had undergone a chemical matte treatment with a barcoater #26, and dried at 100° C. for 3 min to form a film having a thickness after drying of 1 µm. Then, aluminum was evaporated on the surface of the film by vacuum deposition process in a thickness of about 800 Å. The optical density at this time was 3.5.

Reference Example 2

A silicone release agent (NUC SILICONE manufactured by KOHZAI CORPORATION) was sprayed for about 2 sec from the distance of about 20 cm on a PET film (whole cloth was manufactured by Toyo Boseki Kabushiki Kaisha, E5002, thickness 125 µm, chemical matte treatment). Thereafter, aluminum was evaporated by vacuum deposition process in a thickness of about 450 Å on the surface where the silicone release agent had been sprayed. The optical density at this time was 2.5.

Reference Example 3

A commercially available aluminum deposited CPP film (non-oriented polypropylene film: CHEMILIGHT S manufactured NAKAI INDUSTRIES CO., LTD., film thickness: 25 µm, aluminum deposited thickness: 430 Å, optical density: 2.3 was used.

Reference Example 4

An aqueous solution of polyvinyl alcohol (GOHSENOL GH-23 manufactured by NIPPON SYNTHETIC CHEMICAL INDUSTRY CO., LTD., degree of saponification: 88%)/copolymer of polyethylene glycol and polypropylene glycol (SANFLEX SE270 manufactured by Sanyo Chemical Industries, Ltd.)/surfactant (EPAN 740 manufactured by Dai-ichi Kogyo Seiyaku Co., Ltd.)/pure water=10.0 g/7.5 g/0.01 g/332.5 g was applied to a PET film (whole cloth was manufactured by Toyo Boseki Kabushiki Kaisha, E5002, thickness 125 µm, chemical matte treatment performed by TOYOCLOTH CO., LTD.), that had undergone a chemical matte treatment with a barcoater #26, and dried at 100° C. for 3 min to form a film having a thickness after drying of 1.8 µm. Then, aluminum was evaporated on the surface of the film by vacuum deposition process in a thickness of about 500 Å. The optical density at this time was 3.0.

Reference Example 5

An aqueous solution of polyvinyl alcohol (GOHSENOL KH20 manufactured by NIPPON SYNTHETIC CHEMI- CAL INDUSTRY CO., LTD., degree of saponification: 80%)/polyethylene glycol #600 (manufactured by Nacalai Tesque, Inc.)/UV absorbent WF-825 (manufactured by SANNAN KAGAKU)/pure water=2.0 g/1.0 g/0.5 g/106.5 g was applied to a PET film (E5002, whole cloth was manufactured by Toyo Boseki Kabushiki Kaisha, thickness 125 µm, chemical matte treatment performed by TOYOCLOTH CO., LTD.), that had undergone a chemical matte treatment with a barcoater #26, and dried at 100° C. for 3 min to form a film having a thickness after drying of 2 µm. Then, aluminum was evaporated on the surface of the film by vacuum deposition process in a thickness of about 800 Å. The optical density at this time was 4.5.

Comparison Reference Example 1

Using the components shown in the following Table 1, a dispersion containing carbon black, polyvinyl alcohol (GOHSENOL GH-23, manufactured by NIPPON SYNTHETIC CHEMICAL INDUSTRY CO., LTD., degree of saponification: 88%) and a plasticizer was prepared. This dispersion was applied onto a PET film (thickness 125 µm) with a #26 barcoater and dried at 100° C. for 3 min to evaporate water, whereby smooth non-adhesive coating film (coated amount 4.1 g/m² and optical density of actinic radiation area 4.8) was obtained, or a cover film having an IR ablation layer.

TABLE 1

| Component | Amount added (g) | Weight without water (g) | Note |
|---|---|---|---|
| 3% aqueous solution of GH-23 | 53.9 | 36.3 | |
| polyethylene glycol #400 | 1.13 | 25.4 | plasticizer |
| EPAN 740 | 0.004 | 0.09 | dispersant (surfactant) |
| carbon black CW1 | 8.5 | 38.2 | 20% aqueous dispersion |
| distilled water | 36.0 | — | |

Carbon black CW1: manufactured by Orient Chemical Industries, Ltd.

Example 1

A chemical matte PET protective film was released from a photosensitive flexo printing plate (Cosmolight NEO, manufactured by Toyo Boseki Kabushiki Kaisha) consisting of a 100 µm thick PET film support (E5002, manufactured by Toyo Boseki Kabushiki Kaisha), a photosensitive resin layer, a polyvinyl alcohol layer and a chemical matte PET protective film, and a polyvinyl alcohol layer thereunder was removed from the photosensitive resin layer using a conventional adhesive tape. The deposit surface of the aluminum deposited film prepared in Reference Example 1 was superimposed on the exposed photosensitive resin layer, and laminated using a heat press machine at 100° C., 100 kg-weight/cm² to give a plate consisting of a PET support, a photosensitive resin layer, an aluminum deposit layer, a polyvinyl alcohol layer and a chemical matte PET protective film (cover film). The total thickness of this plate was 1.90 mm.

For back exposure to make the relief depth a generally employed depth of about 0.8 mm, the PET support side of the above-mentioned flexo plate was exposed to actinic radiation (light source: Philips 10R, illuminance at 365 nm 7.5 mW/cm²) for 20 sec, and the chemical matte PET protective film (cover film) was peeled off. At this time, the protective film (cover film) alone was peeled off and the polyvinyl alcohol layer and the aluminum deposited layer remained on the photosensitive resin layer. This photosensitive resin layer was observed with a loupe (10× magnification). As a result, breakage and flaws were not observed in the polyvinyl alcohol layer and the aluminum deposited layer. This plate was wound around a rotary drum of Cyrel Digital Imager Spark (manufactured by BARCO) with the polyvinyl alcohol layer on the upper side and the support PET film on the back side. After vacuuming, an image was formed with diode laser. The laser output of this apparatus used was 4.8 mW, laser resolution was 2540 dpi, and laser spot diameter was 15 µm. The rotary drum rotated at 700 rpm. After IR ablation, the plate was taken out and observed with a loupe (10× magnification). As a result, aluminum deposited layer was ablated without any problem.

The entire photosensitive flexo printing plate covered with a digital image mask, which had undergone the above-mentioned IR ablation, was exposed to actinic radiation for 8 min and then developed at 40° C. for 6 min with a developing machine (Stuck System) manufactured by Anderson & Vreeland, Inc. As a developer, used was tap water added with a 1% dishwashing detergent Cascade (manufactured by US Procter & Gamble Company). During development, the remaining IR ablation layer (aluminum deposited layer, polyvinyl alcohol layer) and non-irradiation areas of the photosensitive resin layer were removed, leaving the area exposed to actinic radiation. After the development, it was dried at 60° C. for 20 min, exposed to actinic radiation for 5 min and finally exposed to a germicidal lamp for 5 min to remove surface adhesiveness.

The finished flexo printing plate was examined with a loupe (10× magnification). All the test patterns of 2 point convex part and concave letters, 30 µm wide fine line, 100 µm diameter isolated dot and 156 lpi, 1% halftone dot were found to have been correctly formed.

Example 2

A hydrophilic polymer (10.5 parts) obtained by reacting polytetramethylene glycol (10 parts, G-850, manufactured by Hodoya Chemical Inc.), dimethylol propionic acid (35 parts, FUJIIGI TSUSHO), hexamethylene diisocyanate (25 parts, manufactured by NIPPON POLYURETHANE INDUSTRY CO., LTD.), hydroxyethyl methacrylate (10 parts), amino group-containing acrylonitrile, and butadiene oligomer (35 parts, Hycar ATBNX 1300×16, UBE INDUSTRIES LTD.), nitrile-butadiene rubber (acrylonitrile: 35%) (NIPOL-1042, 33 parts, manufactured by ZEON CORPORATION), butadiene rubber (22 parts, JSR BROLLL), oligo butadiene acrylate (29 parts, PB-A, manufactured by KYOEISHA CHEMICAL Co., LTD), 1,6-hexanediol dimethacrylate (3 parts), as a photoinitiator, benzyldimethylketal (1 part) and hydroquinone monomethylether (0.1 part), toluene (40 parts), and water (10 parts) were kneaded in a heating kneader at 70° C. The solvent was evaporated under reduced pressure to give a photosensitive resin composition. A film comprising a 125 µm thick polyethylene terephthalate film and this photosensitive resin composition coated thereon with a polyester adhesive and the deposited surface of the aluminum deposited film prepared in Reference Example 1 were superimposed and heat pressed in a heat press machine at 100° C., 100 kg-weight/cm² for 1 min to give a plate consisting of a PET support, a photosensitive resin layer, an aluminum deposited layer, a polyvinyl alcohol layer and a chemical matte PET protective film (cover film). The total thickness of this plate was 1.95 mm (1.70 mm for photosensitive resin layer).

In the same manner as in Example 1, the obtained photosensitive resin laminate was subjected to IR ablation. As a result, the radius of 156 lpi, 1% halftone dot was 9.5 µm on average. Thereafter, ablation was repeated in the same manner without changing the laser output but after changing the number of rotation to 700 rpm, and the halftone dot size was measured. As a result, the size was 9.9 µm and the percent change in halftone dot radius per unit energy was 4.70%.

Plate making thereafter in the same manner as in Example 1 gave a flexo plate showing image reproducibility similar to that in Example 1.

Example 3

A PET protective film was peeled off from a photosensitive resin relief printing plate (Printight EF95GC, manufactured by Toyo Boseki Kabushiki Kaisha) consisting of a 100 µm thick PET film support (E5002, manufactured by Toyo Boseki Kabushiki Kaisha), a photosensitive resin layer, a polyvinyl alcohol layer and a PET protective film, and polyvinyl alcohol layer thereunder was removed from the photosensitive resin layer using a conventional adhesive tape. The deposit surface of the aluminum deposited film prepared in Reference Example 1 was superimposed on the exposed photosensitive resin layer, and laminated using a heat press machine at 100° C., 100 kg-weight/cm² to give a plate consisting of a PET support, a photosensitive resin layer, an aluminum deposit layer, a polyvinyl alcohol layer and a chemical matte PET protective film (cover film). The total thickness of this plate was 1.05 mm.

Thereafter, ablation of the obtained plate was performed in the same manner except that back exposure was not performed and the entire photosensitive resin relief printing plate covered with a digital image mask, which had undergone the above-mentioned IR ablation, was exposed to actinic radiation for 2 min and then developed at 25° C. for 2 min with a developing machine (JEM-A2, manufactured by NIHON DENSHI SEIKI CO., LTD.). As a developer, used was tap water. During development, the remaining IR ablation layer (aluminum deposited layer, polyvinyl alcohol layer) and non-irradiation areas of the photosensitive resin layer were removed, leaving the area exposed to actinic radiation. After the development, the plate was dried at 70° C. for 10 min and exposed to actinic radiation for 3 min.

The finished resin relief printing plate was examined with a loupe (10× magnification). Fogging was not observed and all the test patterns of 2 point convex part and concave letters, 30 µm wide fine line, 100 µm diameter isolated dot and 156 lpi, 1% halftone dot were found to have been correctly formed.

Example 4

A nylon salt (390 parts by weight) of ε-caprolactam (610 parts by weight), aminoethylpiperazine and adipic acid was melt polymerized to give a copolymerized polyamide. The thus-obtained polyamide (50 parts) was dissolved in methanol (200 parts) and water (24 parts), and itaconic acid (4 parts), adipic acid (4 parts), bisphenol A diglycidyl ether acrylic acid adduct (32 parts), N-ethyl-p-toluenesulfonamide (8 parts), hydroquinone monomethylether (0.1 part) and benzyldimethylketal (1 part) were added to this solution to give a photosensitive 1 resin composition solution. This solution was delivered to a concentrating machine and concentrated at 110° C. to achieve a residual solvent content of the photosensitive resin layer of 5% and a methanol:water ratio of 6:4, which was sandwiched between a 250µ thick PET film coated with a 20µ thick adhesive and a film having the IR ablation layer of Reference Example 1 and melt formed at 110° C. to give a photosensitive flexo plate having a 680µ thick photosensitive resin layer. The warp of this plate was measured and found to be 0% before exposure to actinic radiation and 10% of change in warp after exposure to actinic radiation. The cover film was removed from this plate and the IR ablation layer after recording an image was exposed to actinic radiation for 3 min without depressurization. The plate was developed with neutral water at 25° C. for 2 min and dried at 70° C. for 10 min. The obtained photosensitive resin showed a sensitivity of 14 steps and the resin hardness by Shore D was 57. The image reproducibility of the printed matter was satisfactory.

Example 5

In the same manner as in Example 1 except that the aluminum deposited layer obtained in Reference Example 2 was used, a flexo printing plate was obtained. The obtained flexo printing plate was examined with a loupe (10× magnification). Fogging phenomenon was not observed and all the test patterns of 2 point convex part and concave letters, 30 µm wide fine line, 100 µm diameter isolated dot and 156 lpi, 1% halftone dot were found to have been correctly formed.

Example 6

In the same manner as in Example 3 except that the aluminum deposited layer obtained in Reference Example 2 was used, a photosensitive resin relief plate was obtained. The obtained relief plate was examined with a loupe (10× magnification). Fogging was not observed and all the test patterns of 2 point convex part and concave letters, 30 µm wide fine line, 100 µm diameter isolated dot and 156 lpi, 1% halftone dot were found to have been correctly formed.

Example 7

In the same manner as in Example 1 except that the aluminum foil layer obtained in Reference Example 3 was used, a flexo printing plate was obtained. The obtained flexo printing plate was examined with a loupe (10× magnification). Fogging was not observed and all the test patterns of 2 point convex part and concave letters, 30 µm wide fine line, 100 µm diameter isolated dot and 156 lpi, 1% halftone dot were found to have been correctly formed.

Example 8

In the same manner as in Example 3 except that the aluminum foil layer obtained in Reference Example 3 was used, a photosensitive resin relief plate was obtained. The obtained relief plate was examined with a loupe (10× magnification). Fogging was not observed and all the test patterns of 2 point convex part and concave letters, 30 µm wide fine line, 100 µm diameter isolated dot and 156 lpi, 1% halftone dot were found to have been correctly formed.

Example 9

In the same manner as in Example 1 except that the aluminum deposited layer obtained in Reference Example 4 was used, a flexo plate was obtained. A chemical matte PET cover film of the obtained plate was peeled off, wound around a cylindrical metal drum with the polyvinyl alcohol layer on the outer side and the PET film support on the inner side, unwound, and placed on a planar surface. The bending radius upon occurrence of wrinkles was not more than 5 cm.

IR ablation and plate making were applied in the same manner as in Example 1 to give a flexo printing plate. The obtained printing plate was examined with a loupe (10× magnification). Fogging was not observed and all the test patterns of 2 point convex part and concave letters, 30 μm wide fine line, 100 μm diameter isolated dot and 156 lpi, 1% halftone dot were found to have been correctly formed.

Example 10

In the same manner as in Example 1 except that the aluminum deposited layer obtained in Reference Example 5 was used, a flexo plate was obtained. The obtained flexo plate was subjected to IR ablation and plate making in the same manner as in Example 1 to give a flexo printing plate. The exposure latitude in the plate making step was confirmed to have been enlarged as compared to Example 1. The obtained flexo printing plate was examined with a loupe (10× magnification). Fogging was not observed and all the test patterns of 2 point convex part and concave letters, 30 μm wide fine line, 100 μm diameter isolated dot and 156 lpi, 1% halftone dot were found to have been correctly formed.

Example 11

In the same manner as in Example 3 except that the aluminum deposited layer obtained in Reference Example 5 was used, a photosensitive resin relief plate was obtained. The obtained resin relief plate was subjected to IR ablation and plate making in the same manner as in Example 2 to give a resin relief printing plate. The exposure latitude of the obtained printing plate in the plate making step was confirmed to have been enlarged as compared to Example 2. The obtained resin relief plate was examined with a loupe (10× magnification). Fogging was not observed and all the test patterns of 2 point convex part and concave letters, 30 μm wide fine line, 100 μm diameter isolated dot and 156 lpi, 1% halftone dot were found to have been correctly formed.

The obtained flexo printing plate was examined with a loupe (10× magnification). Fogging phenomenon was not observed and all the test patterns of 2 point convex part and concave letters, 30 μm wide fine line, 100 μm diameter isolated dot and 156 lpi, 1% halftone dot were found to have been correctly formed.

Comparative Example 1

In the same manner as in Example 1 except that the carbon black-containing IR ablation layer obtained in Comparison Reference Example 1 was used, a flexo plate was obtained.

Then, the PET film, which was a cover film of the obtained plate, was peeled off, and in the same manner as in Example 1, the IR ablation layer was examined upon enlargement with a loupe (10× magnification) before exposure to actinic radiation. As a result, partial breakage and numerous flaws were found. The percent change in halftone dot radius per unit energy was as high as 33.90%.

In the same manner as in Example 1, the plate was developed after exposure to actinic radiation. As a result, the developer was stained with a large amount of carbon black, and the developer could not be used for the production of the next plate. The finished flexo printing plate was examined with a loupe (10× magnification). As a result, small convex parts and defective parts of the relief other than the desired image were found due to the effect of flaws occurred on the aforementioned IR ablation layer, and image reproducibility was poor.

Comparative Example 2

In the same manner as in Example 3 except that the carbon black-containing IR ablation layer obtained in Comparison Reference Example 1 was used, a photosensitive resin relief plate was obtained.

Then, the PET film, which was a cover film of the obtained plate, was peeled off, and in the same manner as in Example 1, the IR ablation layer was examined upon enlargement with a loupe (10× magnification) before exposure to actinic radiation. As a result, partial breakage and numerous flaws were found.

In the same manner as in Example 2, the plate was developed after exposure to actinic radiation. As a result, the developer was stained with a large amount of carbon black, and the developer could not be used for the production of the next plate. The finished resin relief printing plate was examined with a loupe (10× magnification). As a result, small convex parts and defective parts of the relief other than the desired image were found due to the effect of flaws occurred on the aforementioned IR ablation layer, and image reproducibility was poor.

As is clear from the foregoing explanations, according to the present invention, breakage and flaws of IR ablation layer caused when peeling off a cover film can be prevented. Therefore, a high precision mask can be formed, which in turn affords a printing plate that provides high quality printing images. In addition, due to less stain of the developer during development, successive development of plural plates is attainable. Therefore, the present invention contributes greatly to the industry.

This application is based on patent application Nos. 2001-326576, 2001-394640, 2002-005096, 2002-074571, 2002-074570, 2002-111073, 2002-111072, 2002-138866, 2002-261878 and 2002-290253 filed in Japan, the contents of which are hereby incorporated by reference.

What is claimed is:

1. A photosensitive resin laminate comprising a support, a photosensitive resin layer, an IR ablation layer and a cover film, wherein the IR ablation layer comprises a layer consisting essentially of an IR absorbent metal, the IR absorbent metal layer is disposed in contact with the photosensitive resin layer and the IR absorbent metal layer has a thickness of 430 Å–20000 Å.

2. The photosensitive resin laminate of claim 1, wherein the IR absorbent metal layer is an aluminized layer.

3. The photosensitive resin laminate of claim 1 further comprising a non-IR sensitive polymer resin layer between the IR absorbent metal layer and the cover film.

4. The photosensitive resin laminate of claim 3, wherein the non-IR-sensitive polymer resin layer can receive an opaque non-transparent to actinic radiation.

5. The photosensitive resin laminate of claim 3, wherein the non-IR-sensitive polymer resin layer contains a UV absorbent.

6. The photosensitive resin laminate of claim 1, wherein the IR ablation layer has an optical density of not less than 2.0.

7. The photosensitive resin laminate of claim 1, which shows a rate of change in the radius of a halftone dot after IR ablation of not more than ±30% per unit energy (J/cm$^2$).

8. A photosensitive plate comprising the resin laminate of claim 1.

9. A photosensitive flexo plate comprising the resin laminate of claim 1.

10. The photosensitive flexo plate of claim 9, wherein wrinkles are not caused when a bending radius is not more than 5 cm.

11. The photosensitive resin laminate flexo plate of claim 9, further comprising a non-IR-sensitive polymer resin layer between IR absorbent metal layer and the cover film and wherein the non-IR-sensitive polymer resin layer comprises a water-soluble polymer and a plasticizer.

12. A photosensitive letter press plate comprising the resin laminate of claim 1.

13. The photosensitive letter press plate of claim 12, wherein the photosensitive resin layer comprises a composition comprising a polymer binder, an ethylenically unsaturated compound and a photoinitiator, the photosensitive resin laminate shows a rate of warp of within ±2% before exposure to actinic radiation, and a change in the warp after exposure to actinic radiation is not more than 15%.

14. The photosensitive letter press plate of claim 12, wherein the photosensitive resin layer has a residual solvent content of 3–10%.

15. The photosensitive laminate of claim 1, wherein the IR ablation layer consists essentially of an IR absorbent metal.

16. The photosensitive laminate of claim 1, wherein the layer consisting essentially of an IR absorbent metal consists of the IR absorbent metal.

17. A photosensitive resin laminate comprising a support, a photosensitive resin layer, an IR ablation layer and a cover film, wherein the IR ablation layer comprises a layer consisting essentially of an IR absorbent metal, the IR absorbent metal layer is disposed in contact with the photosensitive resin layer, the IR absorbent metal layer has a thickness of 430 Å–20000 Å and a UV absorbent organic polymer layer is on at least one surface of the IR absorbent metal layer which is free of contact with the photosensitive resin layer.

18. The photosensitive laminate of claim 17, wherein the IR ablation layer consists essentially of an IR absorbent metal.

19. The photosensitive laminate of claim 17, wherein the layer consisting essentially of an IR absorbent metal consists of the IR absorbent metal.

* * * * *